United States Patent [19]

Khanna et al.

[11] Patent Number: 4,484,156

[45] Date of Patent: Nov. 20, 1984

[54] TRANSISTOR MICROWAVE OSCILLATORS

[75] Inventors: Amarpal S. Khanna; Pierre Guillon; Yves Garault, all of Limoges, France

[73] Assignee: Centre National de la Recherche Scientifique/(C.N.R.S.), Paris, France

[21] Appl. No.: 359,299

[22] Filed: Mar. 18, 1982

[30] Foreign Application Priority Data

Mar. 18, 1981 [FR] France .............................. 81 05447
Sep. 23, 1981 [FR] France .............................. 81 17934

[51] Int. Cl.³ .............................................. H03B 5/18
[52] U.S. Cl. ...................................... 331/60; 331/96; 331/117 D
[58] Field of Search ........ 331/60, 96, 117 D, 117 FE, 331/117 R

[56] References Cited

U.S. PATENT DOCUMENTS 4,307,352 12/1981 Shinkawa et al. ......... 331/117 D X
4,375,621 3/1983 Schneiter et al. ......... 331/117 D X

FOREIGN PATENT DOCUMENTS 13174 7/1980 European Pat. Off. ........ 331/117 D

Primary Examiner—Siegfried H. Grimm
Assistant Examiner—Robert Pascal
Attorney, Agent, or Firm—Cushman, Darby & Cushman

[57] ABSTRACT

The microwave oscillator, including a transistor (1), e.g. a field-effect transistor, includes a first resonating circuit (2) connected to a first terminal and a second resonating circuit (3) connected to a second terminal of said transistor, each resonating circuit including a microstrip (4,6), to which is coupled a dielectric resonator 5,7, both resonators of both resonating circuits being similar and operating at the same resonating frequency, third terminal of said transistor defining a power output. The oscillator provides two outputs of lower power but with a high $Q_{ext}$, and an output of higher power with a medium $Q_{ext}$.

7 Claims, 3 Drawing Figures

TRANSISTOR MICROWAVE OSCILLATORS

BACKGROUND AND SUMMARY OF THE INVENTION

The present invention relates to microwave oscillators and more specially to FET stable microwave oscillators.

Stable microwave oscillators have recently been developed by using a field-effect transistor and a temperature stable dielectric-ceramic resonator. Such an oscillator is disclosed, for instance, in MTT-26, volume 3, March 1978, IETT Transaction on Microwave Theory and Techniques, and uses a field-effect transistor and a BaTi$_4$O$_9$ resonator. Known oscillators of this type only use a single resonator and should include stabilization or matching circuits, in the form of active or passive systems obtained according to microstrip technique on an alumina substrate.

Similarly to former oscillators, this type of oscillator only includes a single output and is subject to some limitations, such as for instance a low quality rating, owing to the poor overvoltage of microstrip line resonators, the loss of energy resulting from the stabilization system, and the severe hazards of stray frequencies.

The present invention relates to a microwave oscillator having a simple, solid state construction, eliminating the energy losses resulting from a stabilization system, allowing reduction in the hazards of stray frequencies and showing a very high quality rating with, as a consequence, a very low noise level and a substantial reduction of the load effect.

Another aspect of the present invention is the provision of an oscillator of the above-mentioned type having at least two outputs which can be used simultaneously and therefore allow, in the embodiments where it is included, to reduce the number of passive microwave devices such as power coupling or dividing devices.

To this end, according to a feature of the present invention, the transistor microwave oscillator includes a first resonating circuit having a dielectric resonator connected to a first terminal of said transistor and a second resonating circuit having a dielectric resonator connected to a second terminal of said transistor, and means for biasing said transistor, the dielectric resonators of said first and second resonating circuits being similar and operating at the same resonating frequency.

According to a second feature of the invention, the solid state oscillator construction includes resonating circuits made by applying the microstrip technique to an insulating substrate, the ceramic-dielectric resonators being coupled to microstrips in the TE$_{01\delta}$ mode, said transistor being a bipolar transistor, or, advantageously, a field-effect transistor.

The above and other objects, features and advantages of the present invention will become more apparent from the following description when taken in conjunction with the accompanying drawings.

DETAILED DESCRIPTION OF THE INVENTION

Figure 1:
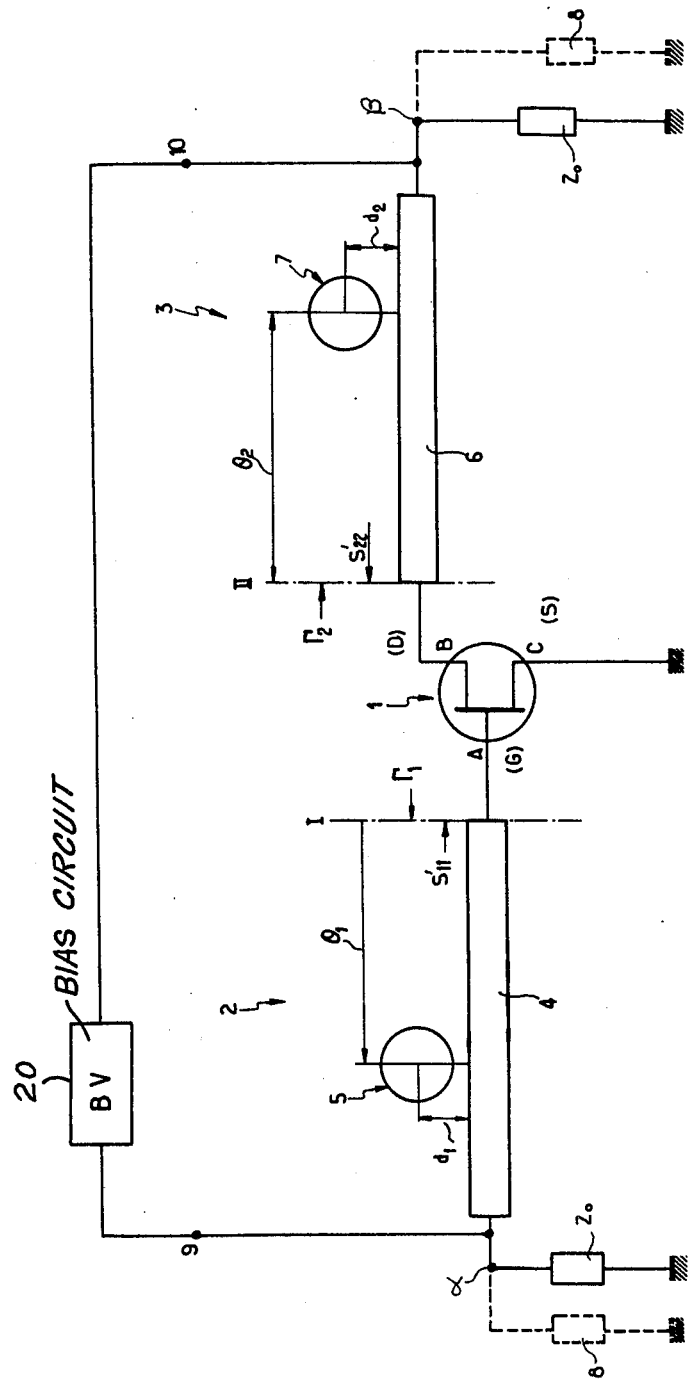
FIG. 1 is a block diagram of a microwave oscillator having two dielectric resonators according to the present invention.
Figure 2:
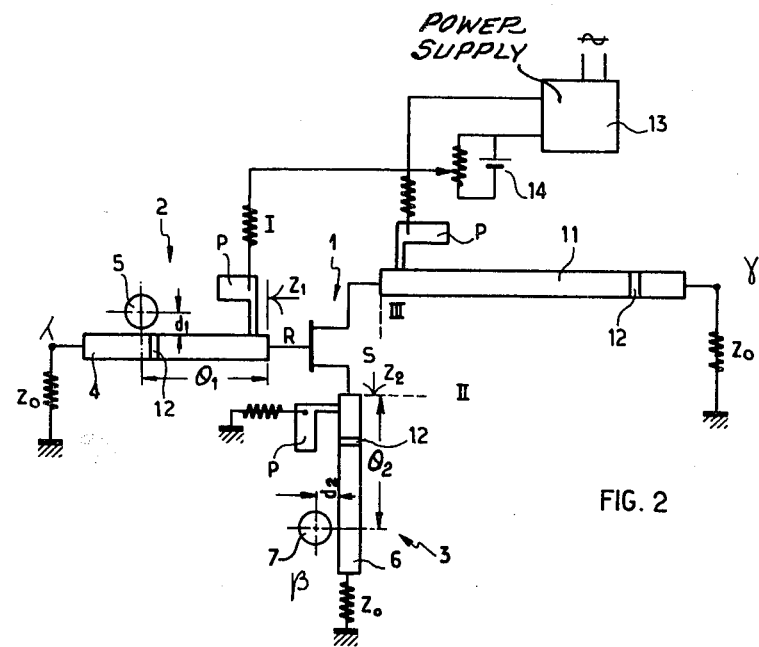
FIG. 2 is a diagram of a modification of the oscillator of the present invention shown in FIG. 1.
Figure 3:
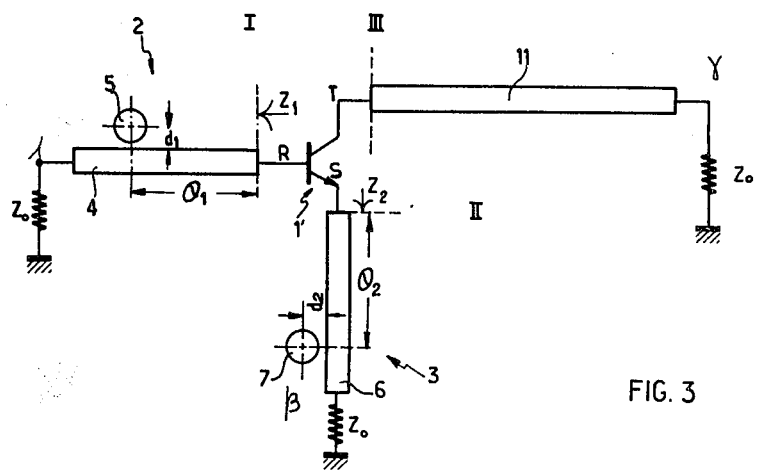
FIG. 3 is a diagram of a microwave oscillator of the same type including a bipolar transistor.

Common elements have been given the same numerals in FIGS. 1, 2 and 3.

Referring to FIG. 1, an oscillator is constructed around a field-effect transistor 1 having an inverted symmetrical channel in an arrangement advantageously including a common source (C=S). The gate (A=G) of said transistor 1 is connected to a first resonating circuit 2, the third terminal B thereof (i.e. drain B=D) being connected to a second resonating circuit 3. Said first resonating circuit 2, providing first output α, includes a microstrip 4 of, for instance, 50 Ohms, typically obtained on an alumina or polytetrafluoretylene glass substrate, the external end of which is coupled to load $Z_0$. With microstrip 4 is associated a dielectric resonator 5, typically a $S_{nx}$, $Z_{r(1-x)}$, $T_iO_4$ (x=0.5/0.34) ceramic resonator made by Thomson-CSF Company, which is assembled on the same substrate as microstrip 4 and coupled therewith in the TE$_{01\delta}$ mode. The resonating frequency of resonator 5 is determined by its size and is possibly directly or externally adjustable, through means provided on the device case (not shown). Likewise, said second resonating circuit 3 includes a microstrip 6 and a dielectric resonator 7, both dielectric resonators 5 and 7 being similar and designed to operate at the same resonating frequency (typically 9 GHz). The external end of microstrip 6 defines a second output terminal β and is connected to a load $Z_0$ similar to that of the other circuit.

The oscillator of the present invention is therefore designed with respect to two reference plans I and II associated with terminals A and B respectively of transistor 1 connected to both resonating circuits. The following two oscillation conditions should be met:

$$S'_{11}\Gamma_1 \geq 1 \text{ and}$$

$$S'_{22}\Gamma_2 \geq 1,$$

with $S'_{11}$ and $S'_{22}$ being the distribution matrix parameters in plans I and II, as schematically shown in FIG. 1, $\Gamma_1$ and $\Gamma_2$ the reflection factors of both resonating circuits and of passive devices associated therewith in these plans I and II. The distribution matrix parameters are determined according to reflection parameters ($S_{11m}$ and $S_{22m}$) modified by transistor 1 load, thereby allowing to calculate admittances $Y_{11m}$ and $Y_{22m}$ in plans I and II by taking into account distances $d_1$ and $d_2$ between resonators 5,7 and associated microstrips 4,6, and $\theta_1$ and $\theta_2$ between resonators 5 and 7 and the associated reference plans I and II for the oscillation frequency determined by the oscillator. $\Gamma_2$ is calculated in order to optimize the external quality rating $Q_{e1}$ of first output α, whereby the same procedure is followed to calculate $\Gamma_1$ and external quality rating $Q_{e2}$ of the second output β. Both quality ratings are calculated by using a low susceptance 8 bridging a load $Z_0$, according to the standing wave rate of said susceptance shunted load by applying well-known methods.

The so designed oscillator, using two similar dielectric resonators which operate as impedance transformers, and optimized by adjusting lengths $\theta_1$, $\theta_2$ and $d_1$, $d_2$, allows, as mentioned above, on one hand to prevent the energy losses occurring in additional stabilization systems, and on the other hand, to reduce the hazards of stray frequencies. In fact, in said oscillator, the oscillation conditions are only met at the resonating frequency of both resonators 5 and 7. Advantageously, this type of oscillator can be used as a microwave energy source (with a fixed frequence) or also as a mixing oscillator, the high quality rating (greater than 20,000 at 9 GHz) and the provision of two outputs being of great interest when included in communication systems.

In accordance with a particular embodiment, transistor 1 is a field-effect transistor of the type sold by Thomson-CSF Company under reference OSC 88,000, both cylindrical dielectric resonators being made of $S_{nx}Z_{r(1-x)}TiO_4$ ceramic having a permittivity $\epsilon_r = 38$, a loss tangent at 10 GHz of $2.5 \times 10^{-4}$ and a temperature coefficient of 3 ppm/°C. At 9 GHz, said oscillator shows optimization features, not taking into account the non-linear phenomena at $\alpha$ output of external quality ratings higher than 40,000 and at $\beta$ output higher than 25,000.

The biasing system BV (20) of transistor 1, supplying terminals 9 and 10 of external ends of microstrips 4 and 6 with $V_{AC}$ and $V_{BC}$ voltages, respectively, according to conventional techniques, is not disclosed in detail, such a biasing system as well as lines coupling dielectric resonator with measuring elements being also obtainable by employing microstrip technology on the same alumina or polytetrafluoroethylene glass dielectric substrate.

As shown in FIGS. 2 and 3, the oscillator is constructed around a transistor 1,1', respectively two terminals of which are connected to two resonating circuits 2,3. A first resonating circuit defining a first output $\alpha$ includes a microstrip 4 and a resonator 5 such as disclosed in relation to FIG. 1.

Similarly, a second resonating circuit 3 includes a microstrip 6 of 50 Ohms and a dielectric resonator 7, both dielectric resonators 5 and 7 being similar and operating at the same resonating frequency (e.g. 9 GHz). The external end of microstrip 6 defines a second output terminal $\beta$ and is connected to a load $Z_0$ similar to that of the other resonating circuit.

A third terminal T of transistor 1,1' (reference plan III) is connected to a 50 Ohm microstrip 11, the output terminal of which, defining a third output $\ominus$, is connected to a load $Z_0$.

The oscillator of the present invention is designed with respect to two reference plans I and II of resonating circuits 2 and 3, associated with terminals R and S of transistor 1,1', respectively. By varying $d_i$ and $\theta_i$, any passive impedance $Z = F(d_i, \theta_i)$ in the input plan I or II can be obtained.

The oscillation condition (small signals) is as follows:

$$|\text{Det. }([S][S'] - [I])| > 0$$

$$\text{Arg.Det. }([S][S'] - [I])| = 0$$

where [S] is the distribution matrix of said transistor and [S'] the passive circuit distribution matrix, [I] being the unit matrix.

From $-S$ parameters at the three terminals of selected transistor, values of $d_1$, $d_2$, $\theta_1$ and $\theta_2$ are determined by means of a computing program in order to optimize the oscillation condition. Therefore, the oscillator is provided with three outputs, a main power output $\ominus$ and two auxiliary outputs $\alpha$ and $\beta$ of lower power but showing excellent quality ratings. The efficiency of the oscillator of the present invention is high, in the order of 20–30%.

In the embodiment of FIG. 2, an oscillator is shown using a field-effect transistor 1 of the type of a transistor sold by the Thomson-CSF Company under reference 15GF, for operating at a frequency of 9 GHz, a first terminal R being the gate, a second terminal S being the source, and a third terminal T being the drain of said field-effect transistor. FIG. 2 also shows the biasing circuit of transistor 1, including, for the various terminals, open-ended, radio frequency band-pass, high impedance biasing integrated circuits P, of solid state design on the same substrate as microstrips 4,6 and $\lambda g/4$ type formed at right angles with a 100 ohm small branch and a 20 ohm large branch. Biasing circuit P of second terminal S is grounded, whilst biasing circuits P of first and third terminals R,T are connected to a 0–10 volt variable stabilized power supply 13, said first terminal (gate R) being biased to said source by means of a battery 14 not to be affected by gate sensitivity to transient states of industrial stabilized power supplies. Capacitive sectors 12 are also provided on microstrips 4,6 and 11 associated with said transistor terminals.

FIG. 3 is a diagram showing a similar arrangement of the oscillator of the present invention, using a single bipolar transistor 1', first terminal R thereof connected to first resonating circuit 4 being the base, second terminal S connected to second resonating circuit 3 being the emitter, whereby output power T is available at collector thereof. Such an arrangement is suitable for medium operating frequencies, e.g. up to 8 GHz.

In the arrangement of FIG. 2, with the dielectric resonators and the field-effect transistor mentioned above, oscillator performances are as follows, when operating at 9 GHz:

|  | Output $\alpha$ | Output $\beta$ | Output $\gamma$ |
| --- | --- | --- | --- |
| RF power | .8 mw | .5 mw | 16 mw |
| $Q_{ext}$ | 16,000 | 18,000 | 1,800 |

Overall efficiency: 20%
Biasing point: $V_{DS} = 4$ V
$I_D = 23$ m
Frequency change v biasing voltage: <300 KHz/V
MF noise:

$< .7 \text{ Hz}/\sqrt{\text{Hz}}$ at 1 KHz $< .2 \text{ Hz}/\sqrt{\text{Hz}}$ at 10 KHz $< .12 \text{ Hz}/\sqrt{\text{Hz}}$ at 100 KHz It will appear that the three outputs show different external quality ratings. Outputs $\alpha$ and $\beta$ show much higher $Q_{ext}$ than $Q_0$ value of the dielectric resonators, whilst output $\gamma$ shows $Q_{ext}$ value of the order of $Q_0$ value of the electric resonators. In the oscillator arrangement according to the invention, there are no stray frequencies as the oscillation condition is only met for the resonating frequency of resonators. For other frequencies, transistor 1 is loaded with a 50 ohm resistance at terminals RST thereof. Alternatively, in order to maximize the power, a $\lambda/4$ transformer can be substituted for microstrip line 11 having a 50 ohm design impedance between third terminal T of plan III and power output $\gamma$ thereof.

Although the present invention has been described in conjunction with the embodiments described herein, it is evident that many alternatives, modifications and variations will be apparent to those skilled in the art.

What we claim is:

1. A transistor microwave oscillator, comprising:
a transistor;

a transistor biasing means; and a first resonating circuit having a dielectric resonator connected to a first terminal of said transistor, and at least a second resonating circuit having a dielectric resonator connected to a second terminal of said transistor;

said dielectric resonators of said first and second resonating circuits being similar and operating at the same resonance frequency, each resonating circuit defining a microwave output.

2. A microwave oscillator as in claim 1, wherein said transistor is a field-effect transistor having an inverted symmetrical channel.

3. A microwave oscillator as in claim 1, wherein said transistor is a field-effect transistor arranged as a common source circuit.

4. A microwave oscillator as in claim 1, wherein said transistor is a bipolar transistor.

5. A microwave oscillator as in claim 1, wherein a third terminal of said transistor is connected to a load, thereby providing a third output for microwaves.

6. A microwave oscillator as in any one of the preceding claims, wherein said resonating circuits result from applying microstrip lines on an insulating substrate, each resonator being coupled to the associated microstrip line in the $TE_{01\delta}$ mode.

7. A microwave oscillator as in claim 6, wherein said resonators are made of $Sn_xZr_{(1-x)}TiO_4$ ceramic material (where $x=0.25/0.34$).

* * * * *